United States Patent
Chen et al.

(10) Patent No.: US 12,010,812 B2
(45) Date of Patent: Jun. 11, 2024

(54) DUST PROOF SYSTEM WITH FILTER MODULE

(71) Applicant: Quanta Computer Inc., Taoyuan (TW)

(72) Inventors: Yi-Chieh Chen, Taoyuan (TW); Yueh-Chang Wu, Taoyuan (TW); Ching-Yi Shih, Taoyuan (TW); Po-Cheng Shen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 228 days.

(21) Appl. No.: 17/701,333

(22) Filed: Mar. 22, 2022

(65) Prior Publication Data
US 2023/0309258 A1    Sep. 28, 2023

(51) Int. Cl.
*H05K 7/20* (2006.01)
*H05K 5/02* (2006.01)
*H05K 5/03* (2006.01)
*F04D 29/70* (2006.01)

(52) U.S. Cl.
CPC ....... *H05K 7/20181* (2013.01); *H05K 5/0256* (2013.01); *H05K 5/03* (2013.01); *H05K 7/20145* (2013.01); *H05K 7/20154* (2013.01); *F04D 29/703* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 2006/0061966 A1* | 3/2006 | Korinsky | H01L 23/467 |
| | | | 257/E23.099 |
| 2008/0253088 A1* | 10/2008 | Tracy | G06F 1/203 |
| | | | 361/695 |

* cited by examiner

*Primary Examiner* — Jerry Wu
(74) *Attorney, Agent, or Firm* — NIXON PEABODY LLP

(57) ABSTRACT

A dust-proof telecommunication system is disclosed. The dust-proof telecommunication system includes a chassis, critical components located within the chassis, and a filter module located within the chassis near at least some of the critical components that need to be cooled. For example, the critical components include a central processing unit (CPU), a system on chip (SoC), a memory module, a PCIe card, and/or a chipset. The filter module has a filter cover that surrounds at least in part the critical components, a first air filter located at an inlet of an airflow, and a second air filter located at an outlet. The critical components located at a protective space within the chassis receive and are cooled by the airflow passing through the air filter.

17 Claims, 6 Drawing Sheets

DUST PROOF SYSTEM WITH FILTER MODULE

FIELD OF THE INVENTION

The present invention relates generally to a dust proof telecom system, and more specifically, to a cooling plate/protective cover with a filter assembly.

BACKGROUND OF THE INVENTION

Telecommunication devices, such as 5G equipment, base stations for cellular networks and servers, typically have compartments for holding various components such as a Printed Circuit Board Assembly (PCBA), a central processing unit (CPU), a system on chip (SoC), a memory module, and an on-board chip. Since telecommunication devices are generally set up in the outdoor environment, the components are protected from adverse environmental conditions and unauthorized access by a protective cover/cooling plate/die-cast heat sink (HS) covering the compartments.

Further, telecommunication devices in harsh locations face a host of challenges, including heavy dust, poor airflow, and extreme temperatures. Outdoor environments or infrequently accessed storage closets with poor airflow can introduce excess dust into server hardware, eventually causing failures. In general, a cooling plate or die-cast HS with a fin structure or fins is designed to dissipate heat generated from the components of the server hardware.

When heat generated from the components accumulates inside the server hardware, it may cause catastrophic failures over time. Generally, electronics that require more power to operate will generate more heat. If the surrounding temperature exceeds the upper limit, the components can break down. Even if it does not break, the excessive heat will negatively affect the component's performance. Further, when electronic components are exposed to excessive heat over a prolonged period, their lifespan shortens. As electronics become more powerful while PCBs get smaller, heat dissipation techniques are more important than ever.

Dust has a negative effect on CPU cooling. New computers run faster in a smaller amount of space, which has less surface area and more heat to dissipate. The results are higher temperatures and greater sensitivity to dust and dirt trapping heat. Thus, a dust filtering system, such as an air-permeable dust filter, is necessary in a computer or server hardware along with air intake/cooling fans and/or vents.

Some devices, such as an edge server enclosed in a cabinet or small closets, are designed as fanless products with a one-piece top cover heat sink (HS) for cooling. In general, the edge servers are compact because they should fit in a limited space. Such devices generally provide Ingress Protection (IP or International Protection Rating) rating of 50. The IP ratings refer to the level of protection offered by an electrical enclosure, against solids and liquids. In an environment where dust or water could damage electronic components, a sealed enclosure is used to prevent such ingress and safe house the electronics. For cooling purposes, a CPU is generally designed as an embedded system on a chip (SoC) soldering on a motherboard, and a memory is designed as on-board chip (memory down).

For example, in a 5G server, system performance is critical and a CPU should be capable of achieving higher performance in a given environment. General-purpose CPUs, such as Intel IceLake-SP, EagleStream-SP or AMD SP3 series, may be equipped with an isolated CPU HS. General-purpose CPUs may be manufactured according to customer requirements so that they can be assembled in a server without changing a motherboard. If a system is designed with an isolated CPU HS, a server should be provided with an air filter in front of a chassis to satisfy the IPSO requirement.

Referring to FIGS. 1A and 1B, to meet the IPSO requirement with a general-purpose server 100, a front bezel 101 with a dust filter is attached to the front side of the server. The front bezel 101 with the dust filter captures dust when external air is introduced into the server 100. However, when attached to the server 100, the front bezel 101, lengthens the depth of the server chassis. For example, a short depth server 100 has a chassis that is 400 mm in depth, as exemplified in FIG. 1A. When a dust filter bezel 101 having 45 mm depth is attached to the server 100, the entire depth of the server with the filter becomes 445 mm, as exemplified in FIG. 1B. However, due to the limitation of the telecom cabinet environment, some edge servers should be designed to have 300 mm~350 mm depth. In this case, main board (MB) placement is too crowded to hold a filter module.

The term "memory down" is used to describe when memory components such as dynamic random access memory (DRAM) devices are physically soldered onto a Printed Circuit Board (PCB). This is an alternative to using mechanical connectors to attach dual in-line memory modules (DIMM) onto a system. Memory down configuration is often found in the embedded platforms due to the variety of constraints and usage models.

With a top one-piece HS, a memory component in a server should be placed according to the memory down solution so that the memory component contacts the HS for heat dissipation. According to the memory down solution, a DRAM chipset is attached on the motherboard. Thus, the memory down solution would require more space on the motherboard than a standard DIMM socket with the same memory capacity. Further, a DIMM is replaceable for different capacity and service requirements. However, the thermal conductivity for a DIMM is not so efficient to transfer heat to the top HS due to insufficient height space in a server. For example, a 1U server is a flat server that takes up one unit of space when mounted in a rackmount or pedestal server chassis. A 1U server is shaped like a pizza box and consists of a core processor, storage, memory slots, ports, and interfaces.

For telecommunication systems with DIMMs, generally a one-piece die-cast fin HS is provided for heat dissipation. For DIMM cooling, air should flow through the DIMM. However, no dust proof solution is provided for such a die-cast fin HS in the prior art.

Therefore, a need exists for an improved frame/cooling plate or die-cast fin that provides dust filtering for the air that flows through the DIMM. Further, addition of an air filter to the telecommunication system should not affect the overall dimension of the telecommunication system. The present disclosure is directed to such a dust-proof telecommunication system that provides easy solution for dust filtering by providing a frame, a protective cover, or a cooling plate with a replaceable/removable filter module.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a dust-proof telecommunication system is disclosed. The dust-proof telecommunication system includes a chassis, a central processing unit (CPU) or system on chip (SoC) located within the chassis, and a filter module located within the chassis near the CPU or SoC. The filter module has a filter cover that surrounds at least in part the CPU or SoC and a first air filter located at an inlet of an airflow. The CPU or SoC is cooled by the airflow.

In some examples, the dust-proof telecommunication system further includes a cooling plate extending between two side walls, the cooling plate and the side walls being arranged to form a protective space for computing components. Further, a fin structure is formed on the cooling plate and extend away from the protective space. Further, an opening is formed on the cooling plate to receive the filter module, and a top surface of the filter cover is aligned with a top surface of the fin structure when the filter module is placed in the opening.

In some examples, the first air filter is located between the top surface and a bottom surface of the filter cover. In some examples, the filter module further has a second air filter located at an outlet of the airflow and between the top surface and the bottom surface of the filter cover. Further, the first air filter is at a first side of the filter cover and the second air filter is at a second side of the filter cover opposite the first side.

In some examples, an opening is formed on the cooling plate for providing access to the protective space. Further, the opening is formed near and/or above at least a portion of the CPU or SoC. Further, the filter module is placed in the opening.

In some examples, the dust-proof telecommunication system further includes a memory module located within the chassis near the CPU or SoC, and the opening is formed near and/or above at least a portion of the CPU or SoC and at least a portion of the memory module.

In some examples, the filter module placed in the opening is replaceably fixed to the cooling plate. In some examples, the filter module is fixed by a tightening mechanism. For example, the tightening mechanism is provided by removable screws passing through the filter module and received at receiving portions of the cooling plate. The filter module is configured to prevent airborne particles from entering the protective space.

According to certain aspects of the present disclosure, a telecommunications frame for mounting computing components is disclosed. The telecommunications frame includes an airflow cooling device, an airflow opening through which cooling air flows, a protective space configured to enclose the computing components, and a replaceable filter module having an air filter. The air filter is positioned near the airflow opening to prevent airborne particles from entering the protective space.

In some examples, the airflow opening is formed on a top side of the airflow cooling device such that at least a central processing unit (CPU) or system on chip (SoC) and a memory module are visible or accessible via the airflow opening when the filter module is removed from the airflow opening.

In some examples, the telecommunications frame further includes a fan array having a plurality of fans. Further, the cooling air generated by the fans and filtered by the air filter causes heat generated in the protective space to dissipate.

According to certain aspects of the present disclosure, a computing device is disclosed. The computing device includes a Printed Circuit Board Assembly (PCBA) on which a plurality of computing components are mounted; a central processing unit (CPU) mounted on the PCBA; a memory module mounted on the PCBA; and a cooling plate covering the PCBA. The cooling plate has a replaceable filter module with an air filter, and at least one of the CPU or the memory module is accessible when the filter assembly is removed from the cooling plate.

In some examples, the computing device further includes a fan array having a plurality of fans. Further, cooling air generated by the fans and filtered by the air filter cools the CPU and the memory module such that heat generated by the CPU and the memory module is dissipated out of the computing device. Furthermore, an overall dimension of the computing device is same regardless of whether the filter module is placed on or removed from an opening configured to receive the filter module.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
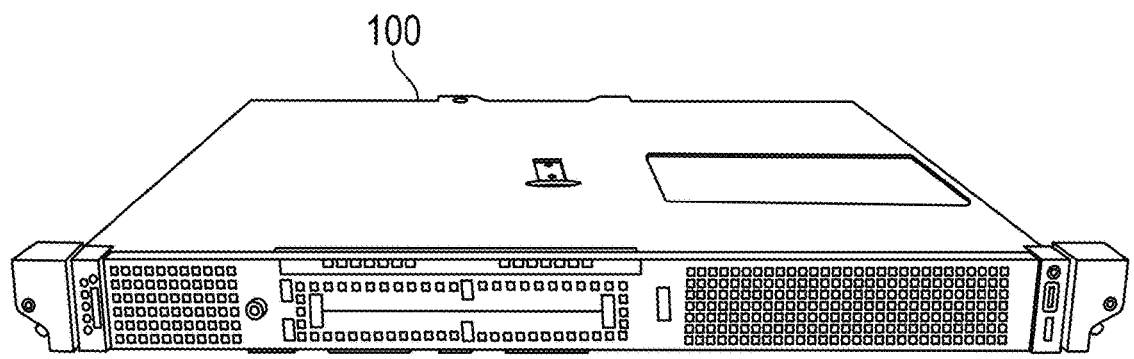
FIG. 1A is a front view of a prior art server without bezel.
Figure 1B:
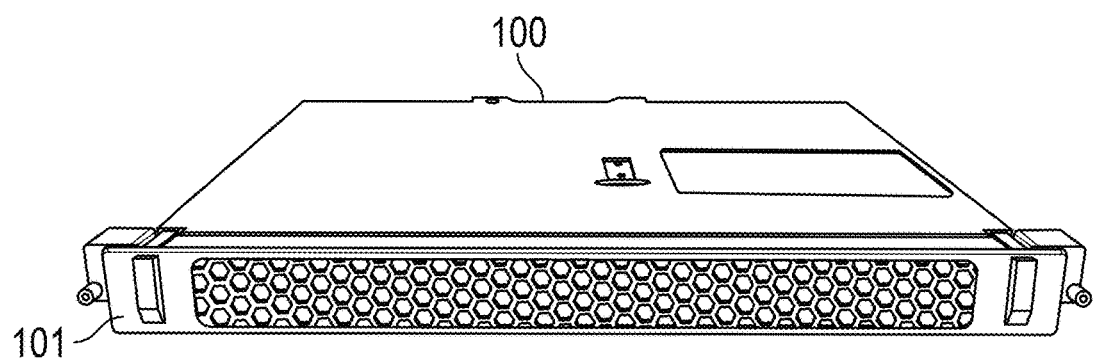
FIG. 1B is a front view of the prior art server with bezel.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to a dust-proof telecommunication system or telecommunications frame with a removable filter module. The filter module should be easily replaceable periodically or based on its condition. Further, even if the filter module is mounted to the telecommunication system or telecommunications frame, the depth should not be affected so that the telecommunication system or telecommunications frame can fit where they need to be installed.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
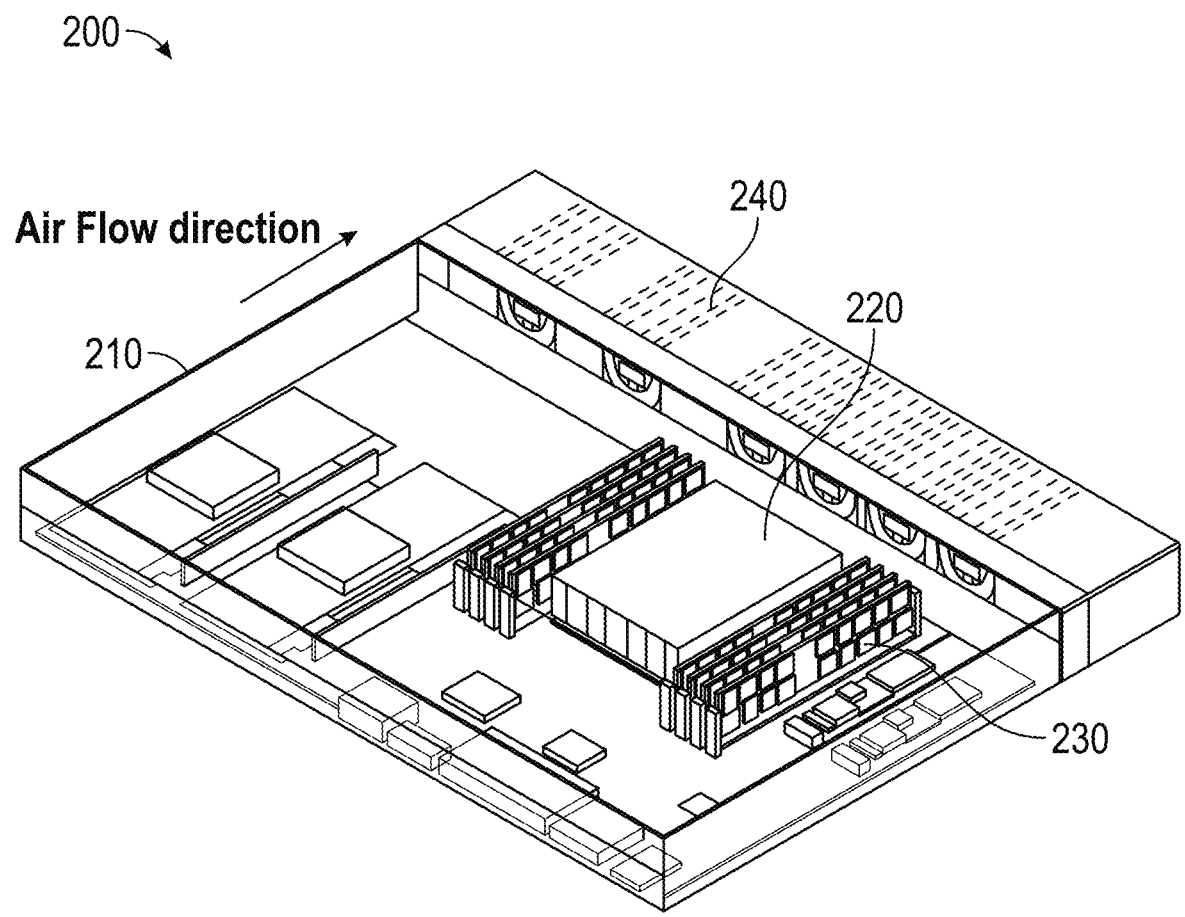
FIG. 2A is a generally perspective view of a telecommunications frame without a protective cover, according to certain aspects of the present disclosure.

Referring to FIG. 2A, a dust-proof telecommunication system 200, according to various embodiments of the present disclosure, has a chassis 210 and various components located within the chassis. For example, the various components include critical components such as a central processing unit (CPU) 220 or system on chip (SoC). In some embodiments, critical components also include a memory module, a PCIe card, and/or a chipset. In general, such critical components cannot be cooled by a cooling plate placed on top of the chassis 210. Further referring to FIG. 2A, the dust-proof telecommunication system 200 also has a DIMM 230 and a fan array 240. The CPU 220 and/or DIMM 230 is cooled by an airflow. FIG. 2A shows the airflow direction. The airflow direction may be different from the direction exemplified in FIG. 2A depending on the system design. For example, the airflow direction is set by the fan array 240.

Figure 2B:
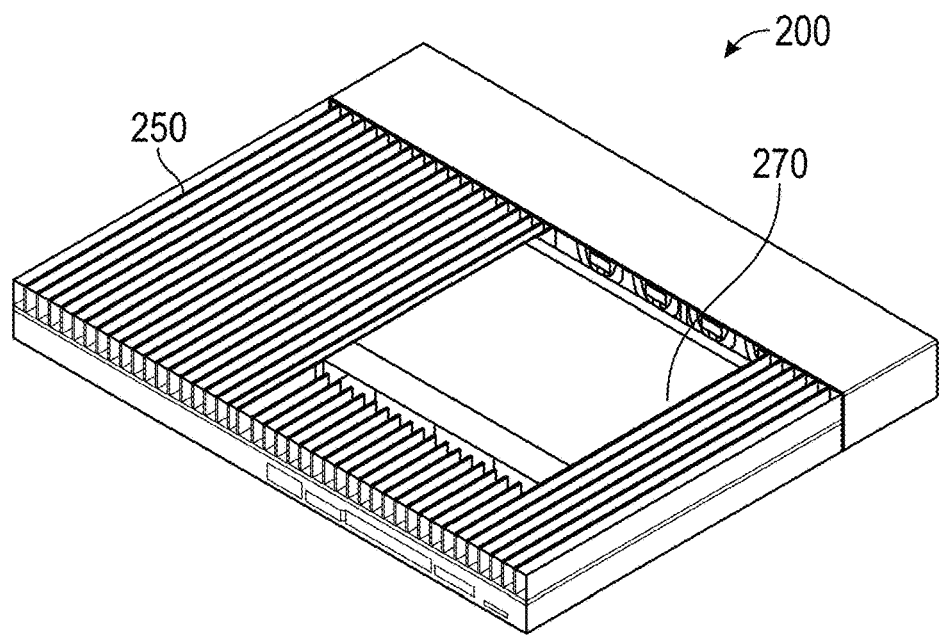
FIG. 2B is a generally perspective view of a telecommunications frame with a protective cover having a filter module mounted thereon, according to certain aspects of the present disclosure.
Figure 2C:
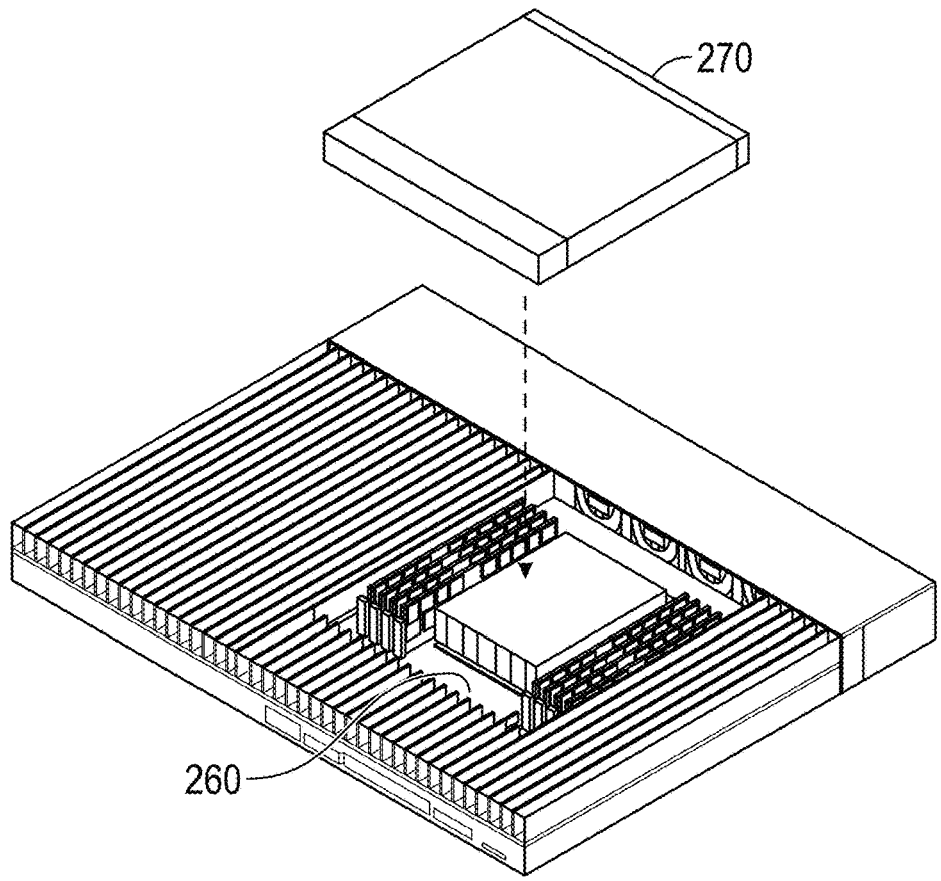
FIG. 2C is a generally perspective view of the telecommunications frame shown in FIG. 2B, the filter module removed from the protective cover, according to certain aspects of the present disclosure.

Referring to FIG. 2B, the dust-proof telecommunication system 200 also has a protective cover 250 to protect the components (including the CPU 220 and DIMM 230) located at a protective space of the chassis 210. According to various embodiments of the present disclosure, the protective cover 250 is configured as a cooling plate. In some embodiments, a fin structure is formed on the cooling plate and extend away from the protective space. For example, the fin structure includes a plurality of fins. For example, the cooling plate is a die-cast heat sink (HS). For example, the die-cast HS is typically made from aluminum, zinc, or magnesium. As shown in FIG. 2C, an opening 260 is formed on the cooling plate/die-cast HS 250 to receive a filter module 270. Some components, such as the CPU 220 and DIMM 230 are at least partially exposed via the opening 260. Thus, the CPU 220 and DIMM 230 may be accessed via the opening 260 for replacement or expansion. The opening 260 is sized to receive the filter module 270 and the filter module may fit the opening tightly when placed at the opening.

As shown in FIGS. 2B and 2C, the filter module 270 is located near the critical components that need to be cooled when the filter module is mounted at the opening 260. For example, the critical components include the CPU 220 and DIMM 230, and in general, these components are not cooled sufficiently by the cooling plate. As exemplified in FIGS. 2B, 2C, and 3, the filter module 270 has a filter cover 270-1 that surrounds at least in part the CPU and/or other critical components that need to be cooled. That is, the filter cover 270-1 is placed around critical components that need to be cooled. For example, the filter cover 270-1 also surrounds components such as a system on chip (SoC), a memory module, a PCIe card, and/or a chipset that cannot be cooled by the cooling plate. As shown in FIG. 2B, the top surface of the filter cover 270-1 is aligned with a top surface of the fin structure of the protective cover 250 or cooling plate when the filter module 270 is mounted at the opening 260. Although a plurality of die cast fins are shown in FIGS. 2B and 2C, a different type of fin structure may be implemented for the protective cover 250. It is noted that the overall dimension of the chassis 210 is not changed even when the filter module 270 is placed at the opening 260, contrary to the conventional air filter that increases the overall length or depth of the chassis when attached to the chassis.

Figure 3:
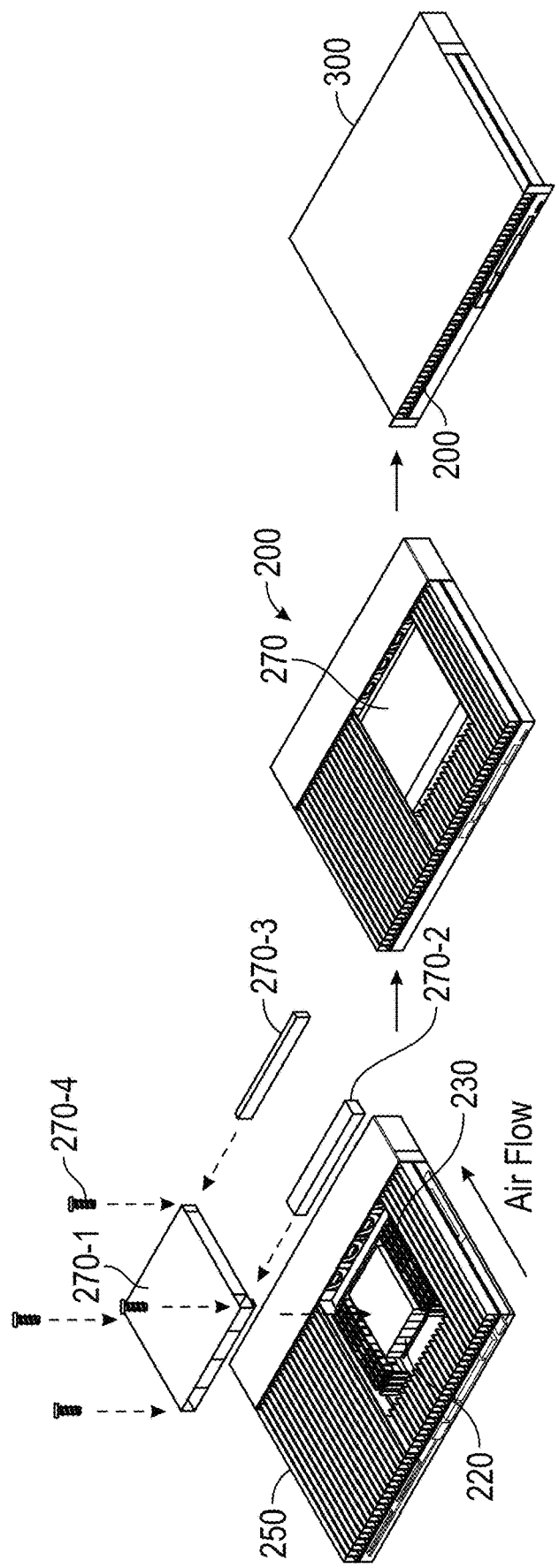
FIG. 3 is generally perspective views of a computing device illustrating the assembly of the computing device, according to certain aspects of the present disclosure.

Referring to FIG. 3, the filter module 270 also has a first air filter 270-2 located at an inlet of the airflow. In some embodiments, the filter module 270 has an additional air filter, a second air filter 270-3 located at an outlet of the airflow. Both the first air filter 270-2 and the second air filter 270-3 are located between the top side and the bottom side of the filter cover 270-1. For example, the first air filter 270-2 is at a first side of the filter cover 270-1 and the second air filter 270-3 is at a second side of the filter cover opposite the first side. The two air filters are exemplified in FIG. 3. In some embodiments, the number of filter(s) is 1, 2, 3, or 4.

In some embodiments, the filter module 270 is pre-assembled and available as a single piece replaceable module such that the entire filter module can be replaced periodically or when the used filter module is dirty or in a bad condition, as exemplified in FIG. 2C. In some embodiments, the filter cover 270-1 is re-usable, and only the first air filter 270-2 and the second air filter 270-3 are replaced. That is, the filter module 270 is removed from the opening 260, the first air filter 270-2 and the second air filter 270-3 are replaced with new ones, and then, the filter cover 270-1 with the new first and second air filters are inserted into the opening. In some embodiments, the filter module 270 placed at the opening 260 is fixed to the protective cover 250 by a tightening mechanism. For example, the filter module is 270 fixed to the protective cover 250 by screws 270-4. In this case, the screws 270-4 passing through the filter module 270 is received at receiving portions of the protective cover/cooling plate 250. However, the tightening mechanism is not limited thereto, and other means may be used.

Referring to FIG. 3 showing the direction of airflow, the cooling air entering the airflow inlet of the chassis 210 passes through at least one of the first air filter 270-2 or the second air filter 270-3 such that airborne particles are prevented from entering the protective space. It is noted that the airflow direction may be different from that shown in FIG. 3 depending on the design of the dust-proof telecommunication system 200. The filtered cooling air passes through the CPU 220 HS and DIMM 230, thus cooling them. Further, heat generated by the components is eventually dissipated via the airflow exhaust or fan array 240 composed of a plurality of cooling fan units.

As shown in FIG. 3, placement of the filter module 270 does not affect the dimension of the dust-proof telecommunication system 200. Therefore, the dust-proof telecommunication system 200 with the filter module 270 can fit a chassis 300 without any problems to be assembled into a rack or cabinet. Thus, the dust-proof telecommunication system 200, according to various embodiments of the present disclosure, provides a very easy way of filtering cooling air introduced into the chassis. That is, used filter modules 270 can be discarded when they need to be replaced, and it is easy to replace them. Therefore, it is very cost-effective, requiring only the filter module 270, rather than a bezel with a filter required in the prior art server.

Figure 4A:
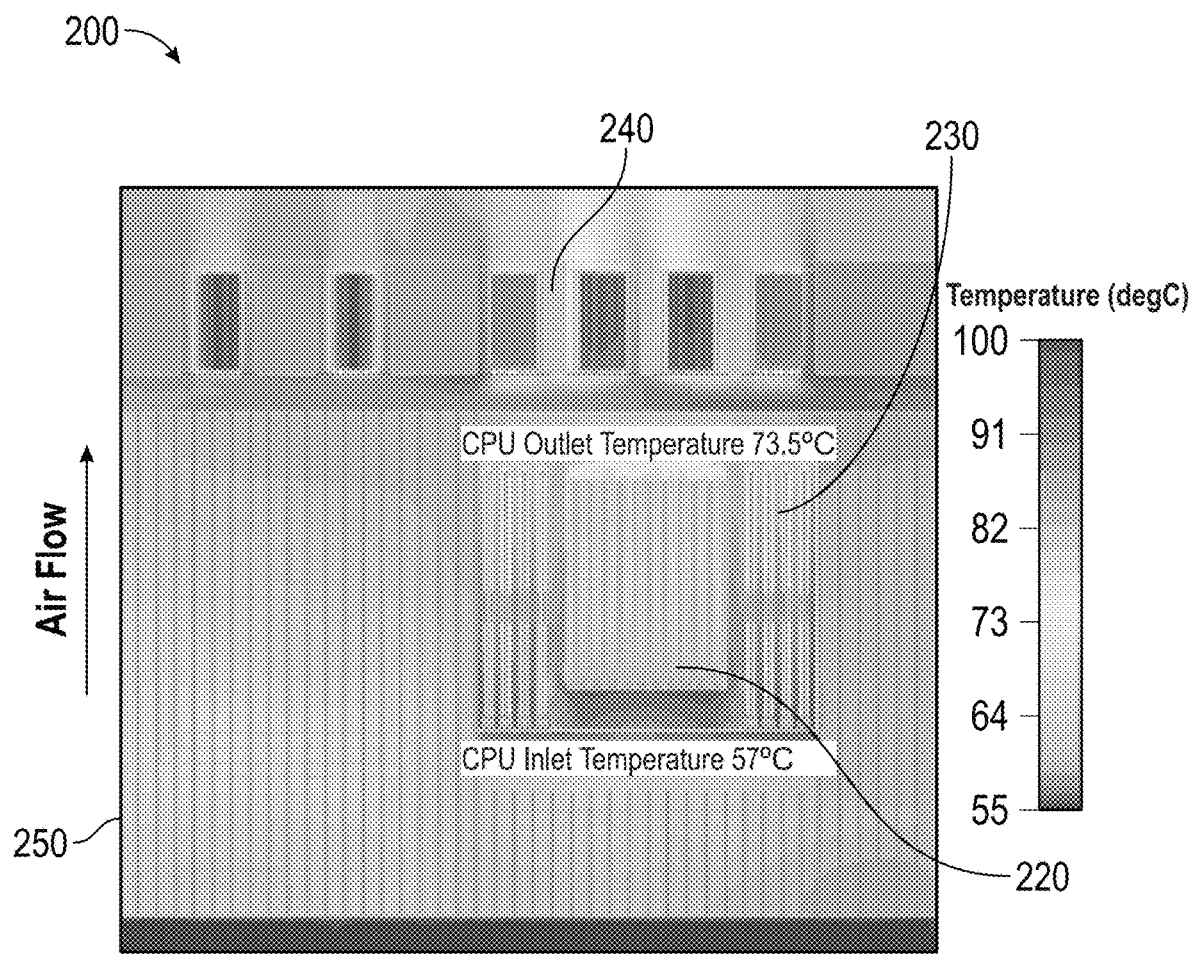
FIG. 4A shows temperature distribution within a telecommunication system, according to certain aspects of the present disclosure.
Figure 4B:
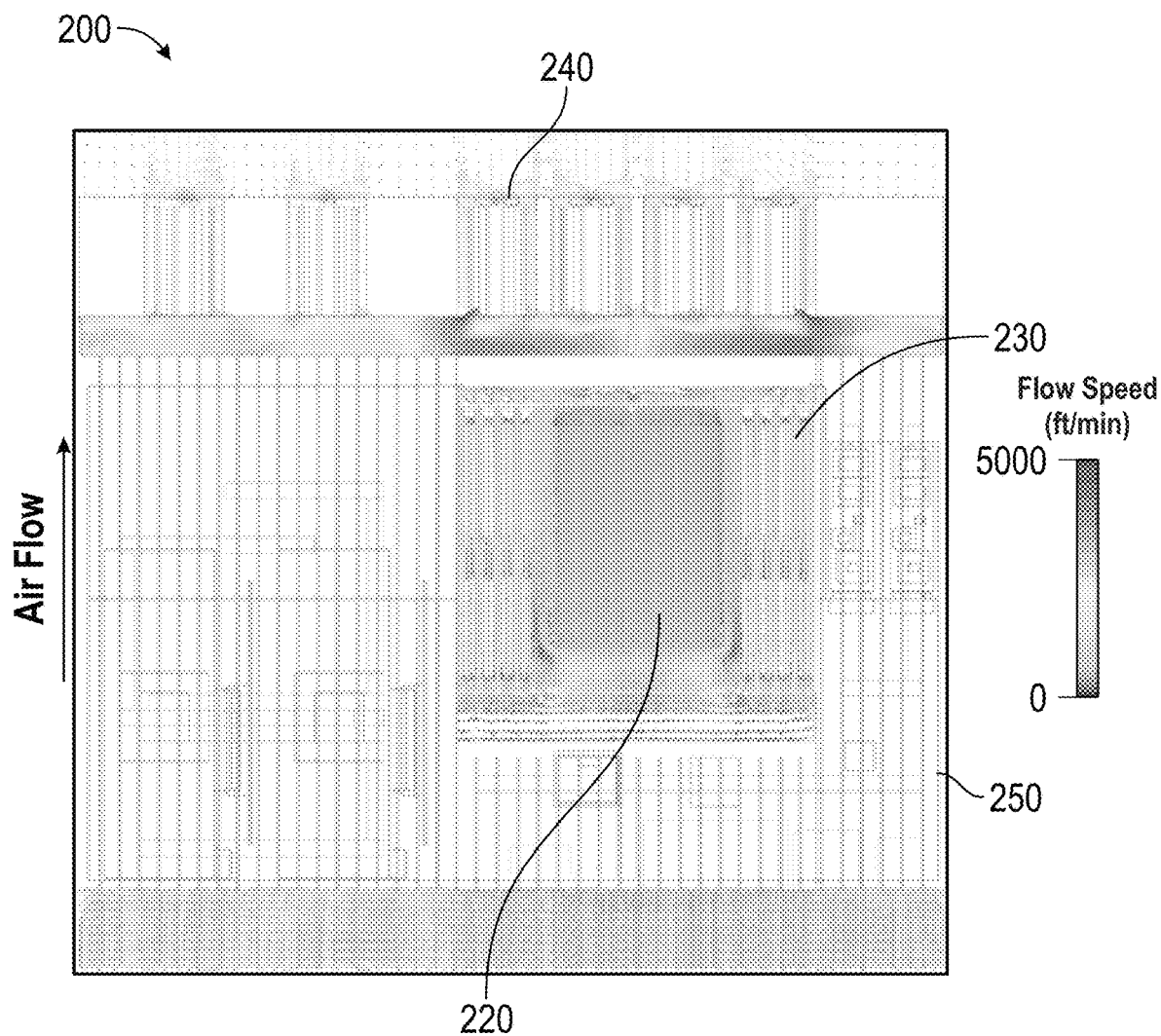
FIG. 4B shows airflow vector plot within a telecommunication system, according to certain aspects of the present disclosure.

FIGS. 4A and 4B show results of thermal simulation placement. According to the results shown in FIG. 4A, heat dissipation of on-board components is effectively conducted to the top HS, the CPU 220 and DIMM 230 being cooled by air. For example, the CPU 220 inlet temperature is 57° C., and the CPU outlet temperature is 73.5° C., indicating that the cooling air takes away heat generated by the CPU. Further, according to the results shown in FIG. 4B, a high-speed airflow passes through the CPU 220 HS and DIMM 230, thus effectively cooling them. These results clearly indicate that airflow is not disrupted by the first air filter 270-2 and/or the second air filter 270-3 of the filter module 270 preventing dust particles from entering the protective space where the CPU 220 and DIMM 230 are located.

The following is the exemplary specification of the filter used in the filter module 270. The thickness of the filter is 5 mm, 10 mm, 15 mm, or 20 mm. The rated airflow of the filter is 1.5 m/s. The average arrestance of the filter is 65%, 70%, 80%, or 90%. The initial pressure drop (pa) of the filter is 15, 18, 20, or 25. The final pressure drop (pa) of the filter is 150, 180, 200, or 250. The dust hold capacity (g/m$^2$) of the filter is 380, 400, 500, or 600. The specification of the filter is not limited to the above-identified values, and may be changed depending on needs.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

One or more elements or aspects or steps, or any portion(s) thereof, from one or more of any of claims below can be combined with one or more elements or aspects or steps, or any portion(s) thereof, from one or more of any of the other claims or combinations thereof, to form one or more additional implementations and/or claims of the present disclosure.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A dust-proof telecommunication system comprising: a chassis; a central processing unit (CPU) or system on chip (SoC) located within the chassis, the CPU or SoC being cooled by an airflow; a cooling plate with a fin structure located within the chassis such that the CPU or SoC is positioned in an opening formed between two parallel portions of the cooling plate; and a filter module placed in the opening, the filter module having a filter cover that surrounds at least in part the CPU or SoC, the filter module further having a first air filter located at an inlet of the airflow, wherein a top surface of the filter cover is aligned with a top surface of the fin structure when the filter module is placed in the opening.

2. The dust-proof telecommunication system of claim 1, wherein the cooling plate has another portion connecting the two parallel portions.

3. The dust-proof telecommunication system of claim 1, wherein the first air filter is located between the top surface and a bottom surface of the filter cover.

4. The dust-proof telecommunication system of claim 3, wherein the filter module further has a second air filter located at an outlet of the airflow and between the top surface and the bottom surface of the filter cover.

5. The dust-proof telecommunication system of claim 4, wherein the first air filter is at a first side of the filter cover and the second air filter is at a second side of the filter cover opposite the first side.

6. The dust-proof telecommunication system of claim 2, wherein the opening is formed on the cooling plate such that the opening is surrounded by the two parallel portions and the another portion of the cooling plate.

7. The dust-proof telecommunication system of claim 6, wherein the opening is formed above at least a portion of the CPU or SoC.

8. The dust-proof telecommunication system of claim 6, further comprising a memory module located within the chassis near the CPU or SoC, wherein the opening is formed near and/or above at least a portion of the CPU or SoC and at least a portion of the memory module.

9. The dust-proof telecommunication system of claim 8, wherein the filter module placed in the opening is located above the CPU or SoC and above the memory module.

10. The dust-proof telecommunication system of claim 1, wherein the filter module placed in the opening is replaceably fixed to the cooling plate.

11. The dust-proof telecommunication system of claim 10, wherein the filter module is fixed by a tightening mechanism or removable screws passing through the filter module and received at receiving portions of the cooling plate.

12. The dust-proof telecommunication system of claim 9, wherein the CPU or SoC and the memory module are not accessible when the filter module is placed in the opening, and the CPU or SoC and the memory module are accessible when the filter module is removed from the opening.

13. A telecommunications frame for mounting computing components, the telecommunications frame comprising: a cooling plate with an opening through which cooling air flows from an inlet, the opening being formed on the cooling plate; a space configured to enclose the computing components; and a replaceable filter module having an air filter, and positioned in the opening shaped to receive the filter module, wherein at least a central processing unit (CPU) or system on chip (SoC) and a memory module are visible or accessible via the opening when the filter module is removed from the opening, the CPU or SoC being and the memory module being covered by the filter module when the filter module is in the opening, and wherein the air filter receives the airflow from the inlet.

14. The telecommunications frame of claim 13, further comprising a fan array having a plurality of fans, wherein the cooling air is generated by the fans and filtered by the air filter.

15. A computing device comprising: a Printed Circuit Board Assembly (PCBA) on which a plurality of computing components are mounted; a central processing unit (CPU) mounted on the PCBA; a memory module mounted on the PCBA; and a cooling plate covering the PCBA and having an opening through which cooling air flows from an inlet, the opening sized and configured to receive a replaceable filter module with an air filter, at least one of the CPU or the memory module being accessible when the filter module is removed from the opening, and the CPU and the memory module being covered by the filter module when the filter module is in the opening, wherein the air filter receives the airflow from the inlet.

16. The computing device of claim 15, further comprising a fan array having a plurality of fans, wherein cooling air generated by the fans and filtered by the air filter cools the CPU and the memory module such that heat generated by the CPU and the memory module is dissipated out of the computing device through the fan array or airflow exhaust.

17. The computing device of claim 15, wherein the filter module received in the opening is placed above the at least one of the CPU or the memory module.

* * * * *